(12) United States Patent
Kimura et al.

(10) Patent No.: US 8,794,498 B2
(45) Date of Patent: Aug. 5, 2014

(54) ELECTRONIC COMPONENT DEVICE AND METHOD FOR PRODUCING THE SAME

(75) Inventors: Yuji Kimura, Otsu (JP); Hiroki Horiguchi, Ritto (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/181,614

(22) Filed: Jul. 13, 2011

(65) Prior Publication Data

US 2011/0268977 A1     Nov. 3, 2011

Related U.S. Application Data

(60) Division of application No. 12/629,990, filed on Dec. 3, 2009, which is a continuation of application No. PCT/JP2008/054011, filed on Mar. 6, 2008.

(30) Foreign Application Priority Data

Jun. 4, 2007    (JP) ................................ 2007-147624

(51) Int. Cl.
| | |
|---|---|
| *B23K 31/02* | (2006.01) |
| *H01L 21/44* | (2006.01) |
| *H01L 21/441* | (2006.01) |
| *B81C 3/00* | (2006.01) |
| *B81C 1/00* | (2006.01) |
| *H01L 23/00* | (2006.01) |

(52) U.S. Cl.
CPC ....... *B81C 3/001* (2013.01); *H01L 2924/16152* (2013.01); *H01L 2924/3025* (2013.01); *H01L 2924/15165* (2013.01); *H01L 2924/15787* (2013.01); *H01L 2924/01079* (2013.01); *B81C 1/00269* (2013.01); *H01L 2924/15153* (2013.01); *B81C 2203/036* (2013.01); *H01L 2224/48091* (2013.01); *H01L 2924/01004* (2013.01); *H01L 24/97* (2013.01); *H01L 24/32* (2013.01); *B81C 2203/019* (2013.01); *H01L 2924/09701* (2013.01); *H01L 2224/48227* (2013.01); *H01L 2224/16* (2013.01); *H01L 2924/16195* (2013.01); *H01L 2924/01327* (2013.01); *H01L 24/48* (2013.01); *B81C 2203/0109* (2013.01); *H01L 2924/01078* (2013.01); *H01L 2924/166* (2013.01); *H01L 24/16* (2013.01)
USPC .................. 228/122.1; 228/123.1; 228/124.5; 438/687; 438/584; 257/772; 257/779

(58) Field of Classification Search
USPC ......... 228/122.1, 123.1, 124.5; 438/687, 584; 257/772, 779
See application file for complete search history.

(56) References Cited

U.S. PATENT DOCUMENTS 4,510,179 A * 4/1985 Honjo et al. ................. 427/97.4

FOREIGN PATENT DOCUMENTS

| JP | 2006135264 A | * | 5/2006 |
| JP | 2006-269970 A | | 10/2006 |
| JP | 2007019360 A | * | 1/2007 |

OTHER PUBLICATIONS

English translation of JP 2007019360 A from Jan. 2007.*
English computer translation JP 2006135264 A.*
Kimura et al.; "Method for Producing Electronic Component Device"; U.S. Appl. No. 12/629,990, filed Dec. 3, 2009.
Official Communication issued in corresponding Japanese Patent Application No. 2009-517740, mailed on May 8, 2012.
* cited by examiner

*Primary Examiner* — Erin Saad
(74) *Attorney, Agent, or Firm* — Keating & Bennett, LLP

(57) ABSTRACT

In a method for producing an electronic component device, a heat bonding step is performed in a state in which low melting point metal layers including low melting point metals including, for example, Sn as the main component, are arranged to sandwich, in the thickness direction, a high melting point metal layer including a high melting point metal including, for example, Cu as the main component, which is the same or substantially the same as high melting point metals defining first and second conductor films to be bonded. In order to generate an intermetallic compound of the high melting point metal and the low melting point metal, the distance in which the high melting point metal is to be diffused in each of the low melting point metal layers is reduced. Thus, the time required for the diffusion is reduced, and the time required for the bonding is reduced.

3 Claims, 5 Drawing Sheets

ELECTRONIC COMPONENT DEVICE AND METHOD FOR PRODUCING THE SAME

BACKGROUND OF THE PRESENT INVENTION

1. Field of the Present Invention

The present invention relates to an electronic component device and a method for producing the same, and particularly to an electronic component device that includes conductor films including high melting point metals that are bonded to each other using a low melting point metal, and a method for producing the same.

2. Description of the Related Art

A known method for producing an electronic component device is illustrated in FIGS. 7-1 to 7-4. FIGS. 7-1 to 7-4 illustrate a process for bonding a first component 1 and a second component 2 to each other that are to be provided in an electronic component device. Such a process is described in, for example, Japanese Unexamined Patent Application Publication No. 2002-110726. The first component 1 illustrated in FIGS. 7-1 to 7-4 is, for example, a semiconductor chip as described in Japanese Unexamined Patent Application Publication No. 2002-110726 and the second component 2 is, for example, a substrate on which a semiconductor chip is mounted.

In a stage before bonding the first component 1 and the second component 2 to each other, a first conductor film 3 is formed on the first component 1 and a second conductor film 4 is formed on the second component 2 as illustrated in FIG. 7-1. The first and second conductor films 3 and 4 include high melting point metals, such as Cu, for example. On the first conductor film 3, an oxidation preventing film 5 including, for example, Au is formed. The oxidation preventing film 5 prevents oxidation of the Cu when the first conductor film 3 includes Cu as described above. In contrast, on the second conductor film 4, a low melting point metal layer 6 including a low melting point metal having a melting point less than that of the high melting point metal is formed. The low melting point metal layer 6 functions as a bonding material, and includes, for example, Sn.

In order to bond the first conductor film 3 and the second conductor film 4 to each other, heating is performed at a temperature between the melting point of the high melting point metals defining the conductor films 3 and 4 and the melting point of the low melting point metal defining the low melting point metal layer 6 while arranging the first conductor film 3 and the second conductor film 4 so as to face each other with the low melting point metal layer 6 being interposed therebetween as illustrated in FIG. 7-1. As a result, first, Au defining the oxidation preventing film 5 dissolves in the low melting point metal layer 6, whereby the state illustrated in FIG. 7-2 is achieved.

When the heating is further continued, the high melting point metals defining the first and second conductor film 3 and 4 are diffused in the low melting point metal layer 6 to form an intermetallic compound of the high melting point metals and the low melting point metal. Then, as illustrated in FIG. 7-3, intermetallic compound layers 7 are formed between each of the first and second conductor films 3 and 4 and the low melting point metal layer 6. Then, finally, the low melting point metal layer 6 disappears, and a bonding portion 8 in which the first conductor film 3 and the second conductor film 4 are bonded to each other through the intermetallic compound layer 7 is formed as illustrated in FIG. 7-4.

The low melting point metal layer 6 has a function of compensating for variations in the spacing between the first conductor film 3 and the second conductor film 4. Therefore, the low melting point metal layer 6 must have a thickness greater than a minimum thickness. However, as the thickness of the low melting point metal layer 6 increases, the time required to diffuse the high melting point metal in the low melting point metal layer 6 increases, which results in a problem of reduced productivity.

In contrast, when the low melting point metal layer 6 is thin in order to solve this problem, the ability to compensate for variations in the spacing between the first conductor film 3 and the second conductor film 4 is reduced, which results in another problem of a poor bonding portion being produced.

Moreover, it is known that the intermetallic compound formed in the intermetallic compound layer 7 is relatively hard and fragile as compared to pure metals. For example, intermetallic compounds produced by combining Cu and Sn, $Cu_6Sn_5$, $Cu_3Sn$, etc., are mentioned. However, when the diffusion amount of Cu in Sn is not sufficient, $Cu_6Sn_5$, which is particularly fragile among the intermetallic compounds listed above, is likely to be produced. When a stress caused by, for example, thermal expansion differences occurs between the first component 1 and the second component 2, the distortion cannot be absorbed, and thus, cracking occurs in a portion at which $Cu_6Sn_5$ is produced, which sometimes causes poor conduction.

In contrast, in order to shorten the time required to bond the first conductor film 3 and the second conductor film 4, Japanese Unexamined Patent Application Publication No. 2007-19360 has proposed a method as illustrated in FIG. 8. FIG. 8 is a figure corresponding to FIG. 7-1. In FIG. 8, components that are equivalent to those illustrated in FIGS. 7-1 to 7-4 are designated by the same reference characters, and the duplicate descriptions thereof are omitted.

Referring to FIG. 8, the first conductor film 3 is formed on the first component 1, and a first low melting point metal layer 6a is formed on the first conductor film 3. In contrast, the second conductor film 4 is formed on the second component 2, and a second low melting point metal layer 6b is formed on the second conductor film 4. Then, a metal powder 9 including a high melting point metal is provided on, for example, the first low melting point metal layer 6a.

To bond the first component 1 and the second component 2 to each other, heating is performed while the first and second low melting point metal layers 6a and 6b are arranged with the metal powder 9 interposed therebetween and then the first conductor film 3 and the second conductor film 4 are arranged to face each other with the low melting point metal layers 6a and 6b interposed therebetween. Thus, the high melting point metal is diffused in each of the low melting point metal layers 6a and 6b not only from the first and second conductor films 3 and 4, but also from the metal powder 9 to form an intermetallic compound. Therefore, the time required to diffuse the high melting point metal throughout the low melting point metal layers 6a and 6b can be reduced.

However, according to the method illustrated in FIG. 8, when the supply amount of the metal powder 9 varies, it becomes difficult to uniformly grow the intermetallic compound from the interface between the first and second low melting point metal layers 6a and 6b. When Cu is used as the high melting point metal and Sn is used as the low melting point metal and the supply amount of the metal powder 9 is not sufficient to form $Cu_3Sn$, fragile $Cu_6Sn_5$ is likely to be formed and, due to the same reasons as described in Japanese Unexamined Patent Application Publication No. 2002-110726 above, cracking is likely to occur, which causes poor conduction.

SUMMARY OF THE PRESENT INVENTION

To overcome the problems described above, preferred embodiments of the present invention provide a method for producing an electronic component device in which a fragile intermetallic compound is not produced and an electronic component device produced by the method.

A method for producing an electronic component device according to a preferred embodiment of the present invention includes a step of individually preparing a first component on which a first conductor film including a first high melting point metal is formed and a second component on which a second conductor film including a second high melting point metal is formed, a step of forming a low melting point metal layer including a low melting point metal having a melting point less than that of the first and second high melting point metals on at least one of the first and second conductor films, and a heat bonding step of, while the first conductor film and the second conductor film are facing each other with the low melting point metal layer being interposed therebetween, performing heating at a temperature between the melting points of the first and second high melting point metals and the melting point of the low melting point metal to form an intermetallic compound of the first and second high melting point metals and the low melting point metal, thereby forming a bonding portion in which the first conductor film and the second conductor film are bonded to each other.

In order to solve the above-described problems, a preferred embodiment of the present invention has the following features.

First, the method for producing an electronic component device according to a preferred embodiment of the present invention preferably further includes a step of forming a high melting point metal layer including the same or substantially the same high melting point metal as either one of the first and second high melting point metals so as to contact the low melting point metal layer. In the low melting point metal layer forming step described above, the low melting point metal layer is formed such that the high melting point metal layer is sandwiched between the low melting point metal layers in the thickness direction in the heat bonding step described above.

The high melting point metal layer formed in the high melting point metal layer forming step preferably has a thickness such that the high melting point metal is supplied in an amount greater than the amount consumed during the formation of the intermetallic compound. The heat bonding step is preferably performed so that the intermetallic compound is produced while leaving a portion of the high melting point metal layer at the bonding portion.

Preferably, the first high melting point metal and the second high melting point metal described above are the same or substantially the same. In this case, when the high melting point metal includes Cu as the main component, the low melting point metal includes Sn as the main component, and the intermetallic compound to be produced is $Cu_3Sn$, preferred embodiments of the present invention are particularly advantageous.

In the above-described preferred embodiment, by performing the low melting point metal layer forming step and the high melting point metal layer forming step, the low melting point metal layer including Sn as the main component is preferably formed on the first conductor film including Cu as the main component and, in contrast, the low melting point metal layer including Sn as the main component is preferably formed on the second conductor film, the high melting point metal layer including Cu as the main component is preferably formed on the low melting point metal layer, and then the low melting point metal layer including Sn as the main component is preferably formed on the high melting point metal layer, in this order.

When the first component is a main substrate on one principal surface of which an electronic circuit formation portion and a first sealing frame surrounding the electronic circuit formation portion are formed, the second component is a cap substrate on one principal surface of which a second sealing frame to be bonded to the first sealing frame is formed, the first sealing frame is defined by the first conductor film, and the second sealing frame is defined by the second conductor film, the method for producing an electronic component device according to various preferred embodiments of the present invention are advantageously utilized to bond the first sealing frame and the second sealing frame to each other.

A first connecting electrode is preferably formed at a position on the one principal surface of the main substrate and is surrounded by the first sealing frame, a second connecting electrode is preferably formed at a position on the one principal surface of the cap substrate and surrounded by the second sealing frame, and a process for electrically connecting the first connecting electrode and the second connecting electrode to each other is preferably performed simultaneously with the heat bonding process.

In the method for producing an electronic component device according to various preferred embodiments of the present invention, a first aggregate substrate and a second aggregate substrate individually providing a plurality of the first and second components are preferably prepared, and the low melting point metal layer forming step, the high melting point metal layer forming step, and the heat bonding step may preferably be performed on the first and second aggregate substrates. In this case, in order to produce a plurality of the first and second components, a step of dividing the first and second aggregate substrates is preferably performed after the heat bonding process.

Preferred embodiments of the present invention are also directed to an electronic component device including the following features that can be advantageously produced by the production methods according to various preferred embodiments of the present invention.

An electronic component device according to a preferred embodiment of the present invention includes a first component on which a first conductor film including a first high melting point metal is provided, a second component on which a second conductor film including a second high melting point metal is provided, and a bonding portion arranged to bond the first conductor film and the second conductor film to each other. The bonding portion includes a first intermetallic compound layer including an intermetallic compound of the first high melting point metal and a low melting point metal having a melting point less than that of the first and second high melting point metals, a second intermetallic compound layer including an intermetallic compound of the second high melting point metal and the low melting point metal, and a high melting point metal layer that is disposed between the first and second intermetallic compound layers and that includes either one of the first and second high melting point metals.

According to the method for producing an electronic component device according to various preferred embodiments of the present invention, the low melting point metal layer is preferably provided with a sufficient thickness such that variations in the spacing between the first conductor film and the second conductor film is sufficiently compensated for, and, in the heat bonding process, the high melting point metal layer is sandwiched between the low melting point metal layers in the thickness direction, i.e., the high melting point metal layer is disposed at the middle in the thickness direction of the low melting point metal layers as a bonding material.

Thus, the distance in which the high melting point metal is to be diffused in the low melting point metal layers can be decreased, and, in accordance therewith, the time required to diffuse the same can be reduced. As a result, the efficiency of the heat bonding process can be significantly improved.

The high melting point metal layer preferably has a thickness such that the high melting point metal can be supplied in an amount greater than the amount consumed during the formation of the intermetallic compound, and thus, the high melting point metal can be sufficiently supplied into the low melting point metal layer. Therefore, when both of the first and second high melting point metals include Cu as the main component and the low melting point metal includes Sn as the main component, Cu in a sufficient amount to form $Cu_3Sn$ as the intermetallic compound can be provided. Thus, the formation of $Cu_6Sn_5$, which is particularly fragile among the intermetallic compounds, is reliably prevented. Therefore, even when a stress caused by, for example, thermal expansion differences, occurs between the first component and the second component, the occurrence of cracking caused by the distortion, which results in poor conduction, is reliably prevented.

Moreover, in particular, it takes a long time to diffuse Sn in Cu, and thus, the above-described effect of shortening the time is particularly advantageous when the high melting point metal includes Cu as the main component and the low melting point metal includes Sn as the main component.

When the high melting point metal includes Cu as the main component and the low melting point metal includes Sn as the main component, a low melting point metal layer including Sn as the main component is preferably provided on the first conductor film including Cu as the main component and, in contrast, when a low melting point metal layer including Sn as the main component is preferably provided on the second conductor film including Cu as the main component, a high melting point metal layer including Cu as the main component is preferably provided on the low melting point metal layer, and then a low melting point metal layer including Sn as the main component is preferably provided on the high melting point metal layer, in this order. Thus, at each of the first conductor film side and the second conductor film side, both the high melting point metal layer and the second conductor film each including, as the main component, Cu that is easily oxidized, are covered with the low melting point metal layer including, as the main component, Sn having a function of preventing oxidation. Therefore, the high melting point metal layer including Cu as the main component and the second conductor film can preferably be advantageously prevented from being oxidized without providing an oxidation preventing film, for example.

When the first component is a main substrate on which a first sealing frame defined by the first conductor film is provided and the second component is a cap substrate on which a second sealing frame defined by the second conductor film is provided, preferred embodiments of the present invention can be advantageously used to bond the first sealing frame and the second sealing frame to each other while forming a sealed space between the main substrate and the cap substrate.

In the above-described preferred embodiments, when the first connecting electrode is formed at a location surrounded by the first sealing frame, the second connecting electrode is formed at the position surrounded by the second sealing frame, and the first connecting electrode and the second connecting electrode are electrically connected to each other simultaneously when the first sealing frame and the second sealing frame are bonded to each other, electrical connection and sealing can be simultaneously performed, thereby increasing the productivity of the electronic component device.

The first and second components are preferably prepared via the first and second aggregate substrates, respectively, and the low melting point metal layer forming step, the high melting point metal layer forming step, and the heat bonding step are performed in a state of the first and second aggregate substrates, the production of a plurality of electronic component devices can be performed at the same time. Thus, an increase in the productivity of the electronic component devices can be achieved. In general, since the aggregate substrate has a wide area and the in-plane variation in the distance between the sealing frames is likely to be relatively large due to bending of the aggregate substrate, the sealing in the aggregate substrate state may produce poor sealing portions. However, with the method for producing an electronic component device according to various preferred embodiments of the present invention, the distance between the sealing frames can be increased while maintaining a relatively short bonding time. Therefore, even when an in-plane variation occurs, sufficient sealing can be performed throughout the aggregate substrate surface while compensating for the in-plane variation.

With the electronic component device according to preferred embodiments of the present invention, the high melting point metal layer is preferably provided between the first and second intermetallic compounds. The high melting point metal is softer than the intermetallic compound.

Therefore, even when a stress originating from thermal expansion differences occurs between the first component and the second component, the high melting point metal layer acts to reduce the stress, thereby effectively preventing the bonding portion from breaking.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 2 is a cross sectional view equivalent to FIG. 1-1 for describing a second preferred embodiment of the present invention.

FIG. 3 is a cross sectional view equivalent to FIG. 1-1 for describing a third preferred embodiment of the present invention.

FIGS. 4A to 4C are views illustrating a first example of an electronic component device to which preferred embodiments of the present invention can be applied; in which FIG. 4A is a cross sectional view of an electronic component device 31, FIG. 4B is a view illustrating a lower principal surface 34 of a cap substrate 33 illustrated in FIG. 4A, and FIG. 4C is a view illustrating an upper principal surface 35 of a main substrate 32 illustrated in FIG. 4A.

FIGS. 7-1 to 7-4 are cross sectional views successively illustrating processes to be provided in an example of a known method for producing an electronic component device.

DETAILED DESCRIPTION OF PREFERRED EMBODIMENTS

FIGS. 1-1 to 1-4 are cross sectional views successively illustrating steps of a method for producing an electronic component device according to a first preferred embodiment of the present invention. FIGS. 1-1 to 1-4 illustrate a process for bonding a first component and a second component 12 to each other that are to be provided in a specific electronic component device. The first and second components 11 and 12 preferably include silicon, glass, or ceramic, for example.

Figure 1:
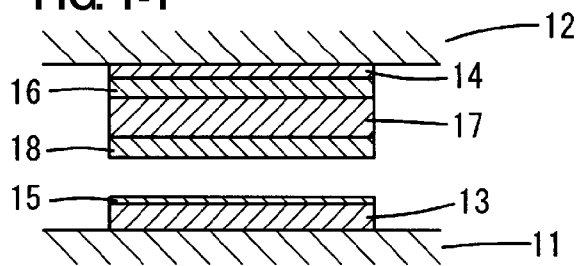
FIGS. 1-1 to 1-4 are cross sectional views illustrating processes provided in a method for producing an electronic component device according to a first preferred embodiment of the present invention.

FIG. 1-1 illustrates a state before the first component 11 and the second component 12 are bonded to each other. On the first component 11, a first conductor film 13 is formed and on the second component 12, a second conductor film 14 is formed. The first and second conductor films 13 and 14 include first and second high melting point metals, respectively. For simplification of the process, the first and second high melting point metals are preferably the same and, for example, include Cu as the main component.

As an example, the first conductor film 13 including Cu as the main component is formed with a thickness of about 4 μm. However, a film including Ti may preferably be formed with a thickness of about 0.05 μm, for example, as a base film contacting the first component 11 (not illustrated). As another example, the second conductor film 14 including Cu as the main component is formed with a thickness of about 4 μm. However, a film including Ti having a thickness of about 0.05 μm, for example, may preferably be formed as a base layer contacting the second component 12 (not illustrated).

On the first conductor film 13, an oxidation preventing film 15 including, for example, Au is preferably formed with a thickness of about 0.1 μm. The oxidation preventing film 15 prevents oxidation of the first conductor film 13 including Cu as the main component.

In contrast, on the second conductor film 14, a first low melting point metal layer 16 including a low melting point metal having a melting point less than that of the high melting point metal, such as Cu, for example, as described above. On the first low melting point metal layer 16, a high melting point metal layer 17 including the high melting point metal is formed. On the high melting point metal layer 17, a second low melting point metal layer 18 including the low melting point metal is further formed. The low melting point metal layers 16 and 18 function as a bonding material, and preferably include, for example, Sn as the main component. The high melting point metal layer 17 includes Cu as the main component similar to the conductor films 13 and 14.

As an example, the thickness of the first low melting point metal layer 16 including Sn as the main component is preferably adjusted to about 3 μm, the thickness of the high melting point metal layer 17 including Cu as the main component is preferably adjusted to about 6 μm, and the thickness of the second low melting point metal layer 18 including Sn as the main component is preferably adjusted to about 3 μm. The thickness of the high melting point metal layer 17 is selected so that the high melting point metal in an amount greater than the amount consumed during the formation of an intermetallic compound can be provided in a heat bonding process, which will be described later.

The formation of the conductor films 13 and 14, the oxidation preventing film 15, the low melting point metal layers 16 and 18, and the high melting point metal layer 17 described above are preferably formed using deposition, sputtering, or metal plating, for example. Compared to the method for supplying metal powder described in Japanese Unexamined Patent Application Publication No. 2002-110726 described above, the film formation methods listed above facilitate the control of the supply amount, i.e., a film thickness, and, according to the film formation methods listed above, variations in the film thickness do not readily occur.

Next, the first component 11 and the second component 12 are arranged near each other and are aligned while the first component 11 and the second component 12 are arranged to face each other as illustrated in FIG. 1-1, and then pressurized. In the pressurization, a pressure of about 5 MPa to about 10 MPa, for example, is preferably supplied. By pressurizing, the oxidation preventing film 15 at the side of the first component 11 and the second low melting point metal layer 18 at the side of the second component 12 contact each other. However, typically, due to the variation in the thickness direction, the oxidation preventing film 15 and the second low melting point metal layer 18 are in contact with each other only at a portion thereof.

A heat bonding step of performing heating at a temperature between the melting point of Cu as the high melting point metal and the melting point of Sn as the low melting point metal is performed while maintaining the above-described pressurization state. In the heat bonding step, an inert atmosphere, such as a nitrogen atmosphere or a vacuum, for example, is preferably applied, and a temperature increase rate is preferably adjusted to 10° C./minute, for example. The melting point of Sn is about 232° C. Thus, the temperature exceeds the melting point and Sn defining the low melting point metal layers 16 and 18 melts. In this case, due to the pressurization described above, the low melting point metal layers 16 and 18 compensate for variations in the thickness direction while being easily deformed, and the oxidation preventing film 15 contacts the second low melting point metal layer 18 over the surface thereof.

Figures 1, 2:
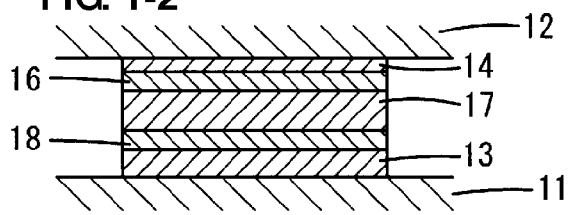

For example, when the temperature reaches about 260° C., the increase in temperature is stopped, and then the temperature is maintained. When heated as described above, Au defining the oxidation preventing film 15 dissolves and disappears in the molten Sn which defines the second low melting point metal layer 18. Thus, as illustrated in FIG. 1-2, the first conductor film 13 at the side of the first component 11 contacts the second low melting point metal layer 18 at the side of the second component 12.

Figures 1, 2, 3:
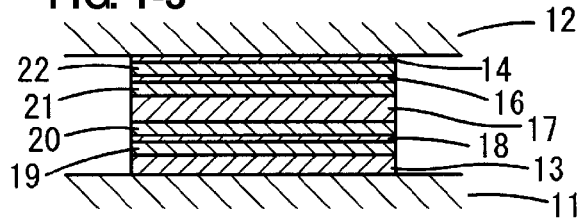
Figures 1, 2, 3, 4:
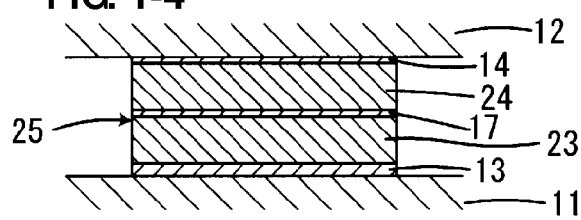
Figure 2:
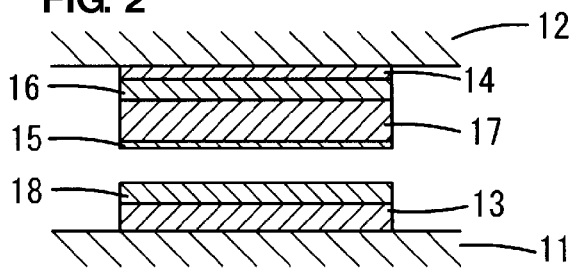
Figure 3:
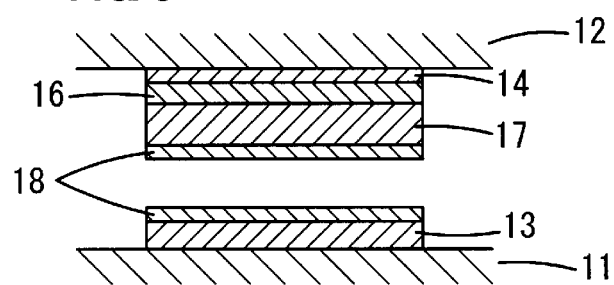

When the heating is further continued, a phenomenon in which Cu defining the high melting point metal is diffused in the molten Sn which defines the low melting point metal, to preferably form an intermetallic compound of Cu and Sn between the first conductor film 13 and the second low melting point metal layer 18, between the second low melting point metal layer 18 and the high melting point metal layer 17, between the high melting point metal layer 17 and the first low melting point metal layers 16, and between the first low melting point metal layer 16 and the second conductor film 14. Therefore, as illustrated in FIG. 1-3, intermetallic compound layers 19, 20, 21, and 22 are preferably formed between the first conductor film 13 and the second low melting point metal layer 18, between the second low melting point metal layer 18 and the high melting point metal layer 17, between the high melting point metal layer 17 and the first low melting point metal layer 16, and between the first low melting point metal layer 16 and the second conductor film 14, respectively.

When the heating described above further continues and the diffusion of Cu in the molten Sn further progresses, the first and second low melting point metal layers 16 and 18 disappear, and, as a result, the intermetallic compound layers 19 and 20 are integrated to form a first intermetallic compound layer 23 and the intermetallic compound layers 21 and are integrated to form a second intermetallic compound layer 24, as illustrated in FIG. 1-4.

Thus, a bonding portion 25 in which the first conductor film 13 and the second conductor film 14 are bonded to each other is formed. At the bonding portion 25, the high melting point metal layer 17 partially remains. Therefore, at the beginning of the formation thereof, the high melting point metal layer 17 has a thickness such that the amount of the high melting point metal is greater than the amount consumed during the formation of intermetallic compounds defining the second intermetallic compound layers 23 and 24.

According to the production method described above, the high melting point metal layer 17 is sandwiched in the thickness direction by the first and second low melting point metal layers 16 and 18 in the heat bonding step while a thickness with which the variation in the interval between the first conductor film 13 and the second conductor film 14 can be sufficiently compensated for is provided for the low melting point metal layers 16 and 18. Thus, the distance in which the high melting point metal is to be diffused in each of the low melting point metal layers 16 and 18 can be reduced, and, in accordance therewith, the time required for the diffusion can be reduced.

After the heat bonding step is completed, the resulting component is cooled at a temperature decrease rate of, for example, about 10° C./minute.

When sufficient Cu is not diffused in the molten Sn, $Cu_6Sn_5$ is likely to be produced as the intermetallic compound. $Cu_6Sn_5$ is hard and fragile, and thus is unsuitable as a bonding material. More specifically, it has been confirmed by an experiment that, when a rupture stress that occurs when a shearing stress is applied to the bonding portion under a temperature of about 280° C. is measured, a rupture stress of about 62.1 MPa is obtained when $Cu_6Sn_5$ is produced but, when $Cu_3Sn$ is produced, a rupture stress of about 230.9 MPa is obtained. Therefore, it is necessary to sufficiently diffuse Cu in the molten Sn to produce $Cu_3Sn$ as the intermetallic compound in the heating and bonding process.

As described above, in order to sufficiently diffuse Cu in the molten Sn to generate $Cu_3Sn$, it is important that the thickness of the high melting point metal layer 17 including Cu as the main component is sufficient and Cu can be sufficiently diffused into Sn.

With respect to each of the conductor films 13 and 14 including Cu as the main component, the low melting point metal layers 16 and 18 including Sn as the main component, and the high melting point metal layer 17 including Cu as the main component, the thickness of the films and the layers formed at a film formation rate determined so that neither non-uniformities nor defects are produced after the formation thereof and the films and the layers can be formed in the shortest amount of time as possible is as follows. The ratio of the total thickness of the conductor films 13 and 14 including Cu as the main component and the high melting point metal layer 17 to the total thickness of the low melting point metal layers 16 and 18 including Sn as the main component (hereinafter referred to as a "Cu thickness/Sn thickness ratio") is preferably at least about 4:3, for example. When the thicknesses of the first conductor film 13, the second conductor film 14, and the high melting point metal layer 17 satisfy the following relationship represented by the following expressions, Cu in an amount sufficient to produce $Cu_3Sn$ can be supplied into Sn and, after bonding, all of the first conductor film 13, the second conductor film 14, and the high melting point metal layer 17 can be made to remain.

(Thickness of First conductor film 13)>4/3×1/2×(Thickness of Second low melting point metal layer 18)

(Thickness of Second conductor film 14)>4/3×1/2×(Thickness of First low melting point metal layer 16)

(Thickness of High melting point metal layer 17)>4/3×1/2×(Thickness of First low melting point metal layer 16+Thickness of Second low melting point metal layer 18)

As described above, when the thickness of the first conductor film 13 is about 4 μm, for example, the thickness of the second conductor film 14 is about 4 μm, the thickness of the first low melting point metal layer 16 is about 3 μm, the thickness of the high melting point metal layer 17 is about 6 μm, and the thickness of the second low melting point metal layer 18 is about 3 μm, the total thickness of the conductor films 13 and 14 including Cu as the main component and the high melting point metal layer 17 is about 14 μm, the total thickness of the low melting point metal layers 16 and 18 including Sn as the main component is about 6 μm, and the Cu thickness/S thickness ratio is about 7:3. Thus, Cu in an amount sufficient to produce $Cu_3Sn$ can be supplied into the Sn. The thickness of the first conductor film 13 is preferably about 4/3×1/2×(Thickness of second low melting point metal layer 18), i.e., greater than about 2 μm, the thickness of the second conductor film 14 is preferably about 4/3×1/2×(Thickness of First low melting point metal layer 16), i.e., greater than about 2 μm, and the thickness of the high melting point metal layer 17 is preferably about 4/3×1/2×(Thickness of First low melting point metal layer 16+Thickness of Second low melting point metal layer 18), i.e., greater than about 4 μm. Thus, after bonding, all of the first conductor film 13, the second conductor film 14, and the high melting point metal layer 17 remain.

Moreover, the thickness of a layer required to supply Cu to be diffused to the low melting point metal layers 16 and 18 each having a thickness of about 3 μm is preferably about 4 μm when conforming to the above-described Cu thickness/Sn thickness ratio. However, at both sides of each of the low melting point metal layers 16 and 18, the layers (the conductor films 13 and 14 and the high melting point metal layer 17) including Cu as the main component are present. Therefore, a layer having a thickness of about 2 μm and including Cu as the main component may be present at each side of each of the low melting point metal layers 16 and 18. Thus, in the high melting point metal layer 17 having a thickness of about 6 μm, an intermetallic compound is produced to a depth of about 2 μm from both surfaces thereof. Thus, the high melting point metal layer 17 including Cu as the main component remains and has a thickness of about 2 μm.

Moreover, in order to sufficiently diffuse Cu in the molten Sn to produce $Cu_3Sn$ as described above, a heat retention temperature and a heat retention time in the heat bonding step are also important. When the heat retention temperature and the heat retention time are insufficient, only $Cu_6Sn_5$ is generated in some cases. In this case, the formation of $Cu_3Sn$ can be accelerated by further elevating the heat retention temperature or further lengthening the heat retention time. For example, it has been confirmed that when heated and maintained at about 260° C., a $Cu_3Sn$ layer having a thickness of about 2 μm is formed by heating and maintaining for about 15 minutes.

The temperature to be applied in the heat bonding process is preferably towards the higher end of a permitted range in the electronic component devices. As the heating temperature increases, the growth rate of $Cu_3Sn$ increases, thereby further reducing the time required for bonding.

FIG. 2 is a cross sectional view equivalent to FIG. 1-1 to describe a method of producing an electronic component device according to a second preferred embodiment of the present invention. In FIG. 2, components equivalent to those illustrated in FIG. 1 are designated by the same reference characters, and the duplicate descriptions thereof are omitted.

In the preferred embodiment illustrated in FIG. 2, the first component 11 is prepared in a state in which the second low melting point metal layer 18 is formed on the first conductor film 13 and the second component 12 is prepared in a state in which a low melting point metal layer is not formed on the high melting point metal layer 17 and the oxidation preventing film 15 is formed thereon.

In the second preferred embodiment, when the first component 11 and the second component 12 are arranged near each other, the heat bonding step is performed, and Au defining the oxidation preventing film 15 dissolves in the second low melting point metal layer 18, a cross sectional structure that is substantially the same as that illustrated in FIG. 1-2 is produced. Therefore, subsequent method steps are the same or substantially the same as those of the first preferred embodiment.

FIG. 3 is a cross sectional view equivalent to FIG. 1-1 to describe a method for producing an electronic component device according to a third preferred embodiment of the present invention. In FIG. 3, components equivalent to those illustrated in FIG. 1 are designated by the same reference characters, and the duplicate descriptions thereof are omitted.

According to the third preferred embodiment, the second low melting point metal layer 18 is divided into two portions in the thickness direction and is formed at both sides of the first component 11 and the second component 12. More specifically, the second low melting point metal layer 18 including Sn as the main component is formed on the first conductor film 13 including Cu as the main component. In contrast, the first low melting point metal layer 16 including Sn as the main component is formed on the second conductor film 14 including Cu as the main component, the high melting point metal layer 17 including Cu as the main component is formed on the first low melting point metal layer 16, and the second low melting point metal layer 18 including Sn as the main component is further formed on the high melting point metal layer 17.

According to the third preferred embodiment, the first conductor film 13 including Cu as the main component is covered with the second low melting point metal layer 18 including Sn as the main component. Thus, it is not necessary to form an oxidation preventing film such that the use of expensive Au can be avoided.

The present invention is described above with reference to the preferred embodiments illustrated in the drawings, but various modifications can be made within the scope of the present invention.

For example, in the above-described preferred embodiments, Cu is preferably used as the high melting point metal, but Au, Ag, and Ni, for example, may be used in addition to Cu. Moreover, the first high melting point metal defining the first conductor film 13 and the second high melting point metal defining the second conductor film 14 may preferably be different from each other. Moreover, the high melting point metals may preferably be used as a pure metal or as a mixture with a slight amount of additives.

In contrast, in the above-described preferred embodiments, Sn is preferably used as the low melting point metal, but In, multi-component Sn-base solder, and Pb base solder, for example, may preferably be used in addition to Sn.

In the preferred embodiments illustrated in the drawings, two layers of the low melting point metal layers 16 and 18 that sandwich the high melting point metal layer 17 are preferably used. For example, three or more low melting point metal layers may preferably be used, such as a low melting point metal layer/a high melting point metal layer/a low melting point metal layer/a high melting point metal layer/a low melting point metal layer/a high melting point metal layer, for example.

The production method according to preferred embodiments of the present invention is applied to a method of producing an electronic component device including conductor films including high melting point metals that are bonded to each other using a low melting point metal. As such an electronic component device, filters, oscillators, MEMS (Micro Electro Mechanical Systems) components, etc., may be produced, for example. As the MEMS components, a gyroscope, an acceleration sensor, etc., may be produced, for example. Hereinafter, the specific structure of an electronic component device according to a preferred embodiment of the present invention will be described.

Figure 4A:
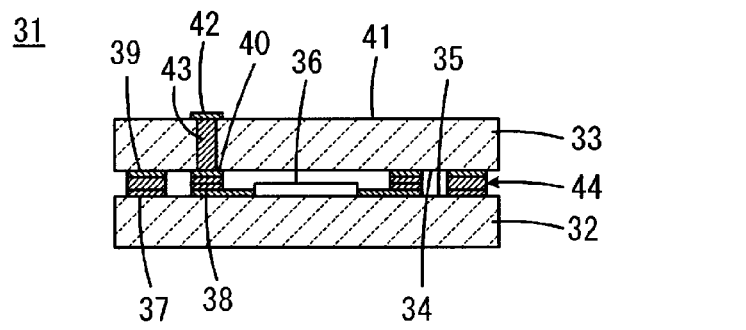
Figure 4B:
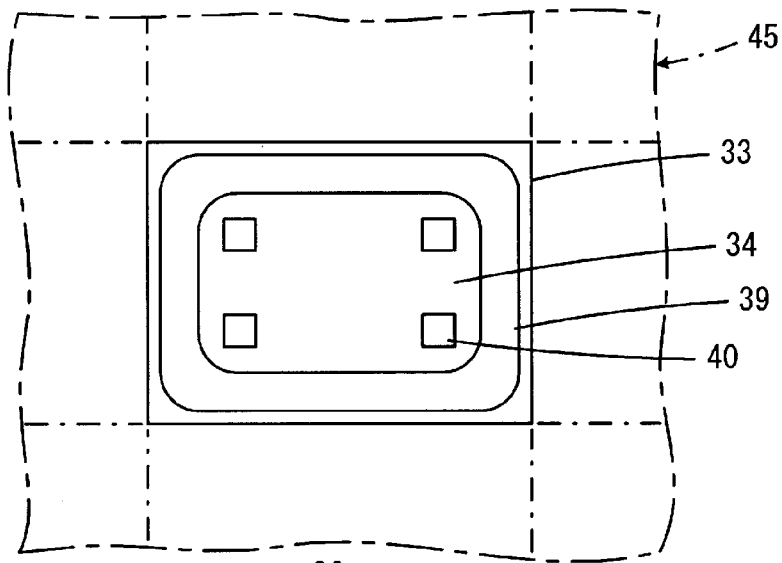
Figure 4C:
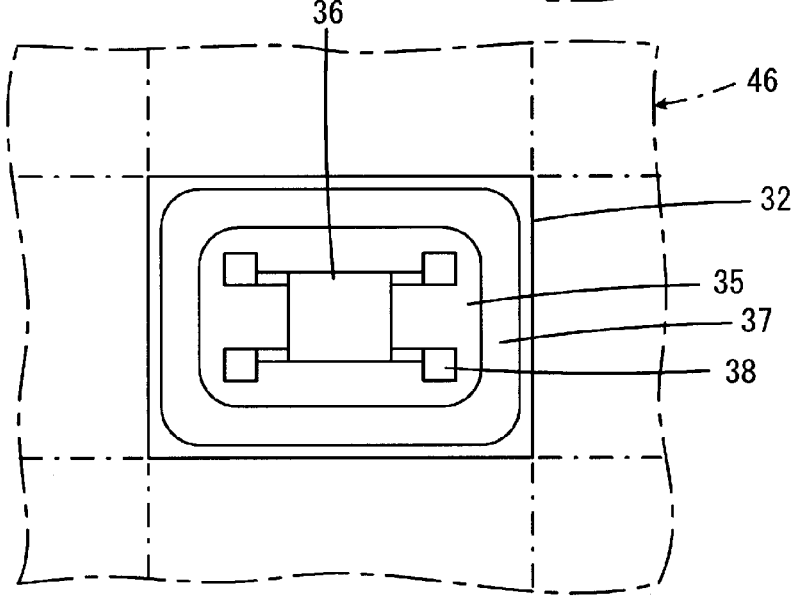

FIGS. 4A to 4C illustrate a first example of such an electronic component device according to a preferred embodiment of the present invention. The electronic component device 31 has a cross sectional structure as illustrated in 4A and has a main substrate 32 and a cap substrate 33 facing the main substrate 32 at an interval. The structure of a lower principal surface 34 of the cap substrate 33 is illustrated in FIG. 4B and the structure of an upper principal surface 35 of the main substrate 32 is illustrated in FIG. 4C.

On the upper principal surface 35 of the main substrate 32, an electronic circuit formation portion 36 and a first sealing frame 37 surrounding the electronic circuit formation portion 36 are provided. At a position on the upper principal surface 35 of the main substrate 32 and surrounded by the first sealing frame 37, first connecting electrodes 38 extending from the electronic circuit formation portion 36 are provided.

In contrast, on the lower principal surface 34 of the cap substrate 33, a second sealing frame 39 to be bonded to the first sealing frame 37 is provided. At a position on the lower principal surface 34 of the cap substrate 33 and surrounded by the second sealing frame 39, second connecting electrodes 40 corresponding to the first connecting electrodes 38 are provided. On the upper principal surface 41 of the cap substrate 33, terminal electrodes 42 are provided. The terminal electrodes 42 are electrically connected to the second connecting electrodes 40 via through hole conductors 43 arranged so as to penetrate the cap substrate 33 in the thickness direction.

To produce such an electronic component device 31, the production method described with reference to FIGS. 1-1 to 1-4 may preferably be used. The equivalent relationship between the electronic component device 31 and the components illustrated in FIGS. 1-1 to 1-4 is as follows: the main substrate 32 is equivalent to the first component 11 and the cap substrate 33 is equivalent to the second component 12. The first sealing frame 37 is equivalent to the first conductor film 13 and the second sealing frame 39 is equivalent to the second conductor film 14. In order to bond the first sealing frame 37 and second sealing frame 39 to each other, the method illustrated in FIGS. 1-1 to 1-4 is preferably used. In FIG. 4A, the bonding portion 44.

Preferably, a step of electrically connecting the first connecting electrodes 38 and the second connecting electrodes 40 to each other is performed simultaneously with a heat bonding step to bond the first sealing frame 37 and second sealing frame 39 to each other. In this case, in the first connecting electrode and the second connecting electrode 40, the same or substantially the same cross sectional structure as in the case of the first sealing frame 37 and the second sealing frame 39 may preferably be used.

The main substrate 32 and the cap substrate 33 are prepared as aggregate substrates 45 and 46 as illustrated by the phantom lines in FIGS. 4C and 4B, respectively. The low melting point metal layer forming step, the high melting point metal layer forming step, and the heat bonding step described above are performed on the aggregate substrates 45 and 46. In order to produce a plurality of the main substrates 32 and the cap substrates 33 from the aggregate substrates 45 and 46, the aggregate substrates 45 and 46 may be divided after the heat bonding step.

When the intermetallic compound layer formed at the bonding portion 44 includes $Cu_3Sn$ in the electronic component device 31 illustrated in FIGS. 4A to 4C as described above, the electronic circuit formation portion 36 surrounded by the sealing frames 37 and 39 are hermetically sealed with high reliability because the $Cu_3Sn$ has a dense structure.

The melting point of $Cu_3Sn$ is about 676° C. Thus, even when reflow (peak temperature: about 260° C.) is applied to surface mount the electronic component device 31, high reliability can be maintained in the electrical conduction properties and the hermetic sealing properties, while not causing re-melting at the bonding potion 44.

Figure 5:
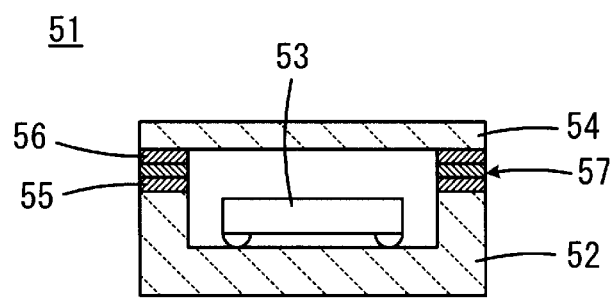
FIG. 5 is a cross sectional view illustrating a second example of an electronic component device to which preferred embodiments of the present invention can be applied.
Figure 6:
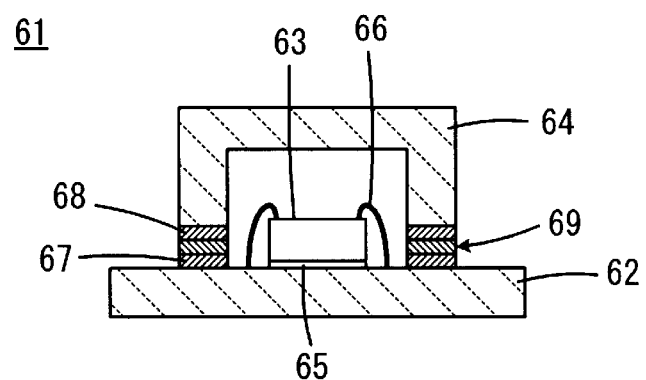
FIG. 6 is a cross sectional view illustrating a third example of an electronic component device to which preferred embodiments of the present invention can be applied.
Figures 1, 7:
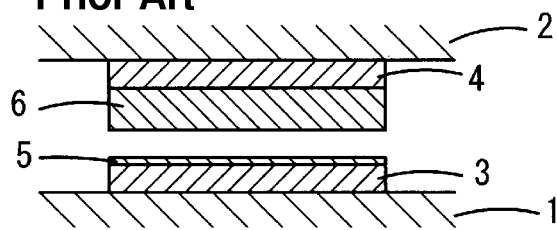
Figures 2, 7:
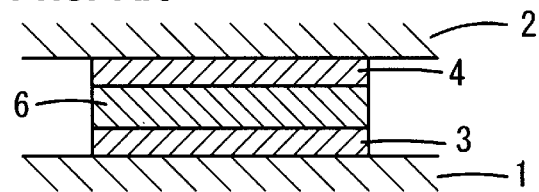
Figures 3, 7:
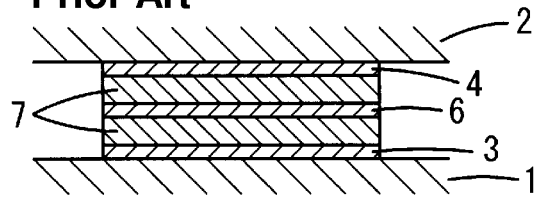
Figures 4, 7:
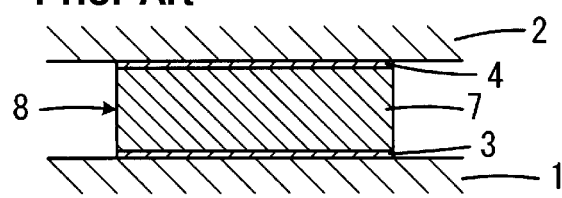
Figure 8:
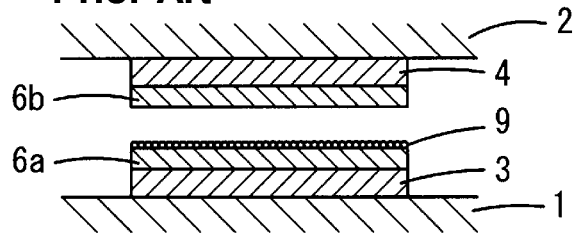
FIG. 8 is a cross sectional views equivalent to FIG. 7-1 for describing an example of a known method for producing an electronic component device.

FIGS. 5 and 6 illustrate the second and third examples of the electronic component device according to preferred embodiments of the present invention.

An electronic component device 51 illustrated in FIG. 5 includes a lid 54 that is bonded to a ceramic package 52 in order to accommodate an electronic component chip 53 in the ceramic package 52 and seal the electronic component chip 53. The electronic component chip 53 is flip-chip mounted on the ceramic package 52.

In order to produce such an electronic component device 51, the production method described with reference to FIGS. 1-1 to 1-4 may preferably be used. The equivalent relationship between the electronic component device 51 and the components illustrated in FIG. 1 is as follows: the ceramic package 52 is equivalent to the first component 11 and the lid 54 is equivalent to the second component 12. A first conductor film 55 that is equivalent to the first conductor film 13 is provided at the peripheral edge portion of an opening of the ceramic package 52 and a second conductor film that is equivalent to the second conductor film 14 is provided at the bottom surface of the lid 54. In order to bond the first conductor film 55 and the second conductor film 56 to each other, the method as illustrated in FIGS. 1-1 to 1-4 may preferably be used. In FIG. 5, the bonding portion 57 is illustrated.

An electronic component device 61 illustrated in FIG. 6 includes an electronic component chip 63 that is mounted on a substrate 62 and a shield case 64 that is bonded to the substrate 62 to shield and seal the electronic component chip 63. The electronic component chip 63 is mechanically fixed to the substrate 62 through a bonding material 65 and also is electrically connected thereto by wire bonding 66.

In order to produce such an electronic component device 61, the production method described with reference to FIGS. 1-1 to 1-4 may preferably be used. The equivalent relationship between the electronic component device 61 and the components illustrated in FIG. 1 is as follows: the substrate 62 is equivalent to the first component 11 and the shielding case 64 is equivalent to the second component 12. A first conductor film 67 that is equivalent to the first conductor film 13 is provided on the upper surface of the substrate 62 and a second conductor film 68 that is equivalent to the second conductor film 14 is provided at the peripheral edge portion of an opening of the seal and case 64. In order to bond the first conductor film 67 and the second conductor film 68 to each other, the method illustrated in FIGS. 1-1 to 1-4 may preferably be used. In FIG. 5, the bonding portion 69 is illustrated.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An electronic component device, comprising:
   a first component on which a first conductor film including a first high melting point metal is provided;
   a second component on which a second conductor film including a second high melting point metal is provided; and
   a bonding portion arranged to bond the first conductor film and the second conductor film to each other; wherein
   the bonding portion includes a first intermetallic compound layer including an intermetallic compound of the first high melting point metal and a low melting point metal having a melting point less than that of the first and second high melting point metals, a second intermetallic compound layer including an intermetallic compound of the second high melting point metal and the low melting point metal, and a high melting point metal layer that is arranged between the first and second intermetallic compound layers and that is softer than the intermetallic compounds of the first and second intermetallic compound layers and that includes one of the first and second high melting point metals;
   the first high melting point metal of the first conductor film, the second high melting point metal of the second conductor film, and the one of the first and second high melting point metals of the high melting point metal layer include Cu as a main component;
   the low melting point metal includes Sn as a main component;
   the intermetallic compounds of the first and second intermetallic compound layers are $Cu_3Sn$;
   the high melting point metal layer that is arranged between the first and second intermetallic compound layers does not include any non-uniformities or defects and is formed by deposition, sputtering, or metal plating;
   the first component is a main substrate on one principal surface of which an electronic circuit formation portion and a first sealing frame surrounding the electronic circuit formation portion are provided;
   the second component is a cap substrate on one principal surface of which a second sealing frame to be bonded to the first sealing frame is provided; and
   the first sealing frame is defined by the first conductor film and the second sealing frame is defined by the second conductor film.

2. The electronic component device according to claim 1, wherein
- a first connecting electrode is provided on the one principal surface of the main substrate and surrounded by the first sealing frame;
- a second connecting electrode is provided on the one principal surface of the cap substrate and surrounded by the second sealing frame.

3. The electronic component device according to claim 2, wherein
- a terminal electrode is provided on another principal surface of the cap substrate opposite to the one principal surface of the cap substrate;
- a through hole conductor is provided in the cap substrate so as to extend through the cap substrate from the one principal surface to the another principal surface of the cap substrate; and
- the second connecting electrode and the terminal electrode are connected to one another via the through hole conductor.

* * * * *